United States Patent [19]

Kumar

[11] Patent Number: 5,382,315

[45] Date of Patent: * Jan. 17, 1995

[54] METHOD OF FORMING ETCH MASK USING PARTICLE BEAM DEPOSITION

[75] Inventor: Nalin Kumar, Austin, Tex.

[73] Assignee: Microelectronics and Computer Technology Corporation, Austin, Tex.

[*] Notice: The portion of the term of this patent subsequent to Sep. 14, 2010 has been disclaimed.

[21] Appl. No.: 120,264

[22] Filed: Sep. 13, 1993

Related U.S. Application Data

[63] Continuation-in-part of Ser. No. 736,357, Jul. 26, 1991, Pat. No. 5,244,538, and a continuation-in-part of Ser. No. 52,958, Apr. 23, 1993, Pat. No. 5,312,514, which is a continuation of Ser. No. 789,220, Nov. 7, 1991, abandoned, and a continuation-in-part of Ser. No. 896,126, Jun. 9, 1992, Pat. No. 5,290,732, which is a continuation of Ser. No. 653,609, Feb. 11, 1991, Pat. No. 5,156,997.

[51] Int. Cl.$^6$ .............................................. H05K 3/00
[52] U.S. Cl. .................................. 156/643; 156/644; 156/659.1
[58] Field of Search .............. 156/644, 659.1, 668, 156/643; 427/96, 256, 531, 123, 125; 437/228

[56] References Cited

U.S. PATENT DOCUMENTS

| | | | |
|---|---|---|---|
| 3,625,758 | 12/1971 | Stahl et al. | 428/206 |
| 4,428,796 | 1/1984 | Milgram | 156/668 X |
| 4,566,937 | 1/1986 | Pitts | 156/659.1 X |
| 4,612,085 | 9/1986 | Jelks et al. | 156/643 |
| 4,666,737 | 5/1987 | Gimpelson et al. | 156/644 X |
| 4,764,485 | 8/1988 | Loughran et al. | 437/225 |
| 4,800,176 | 1/1989 | Kakumu et al. | 437/203 X |
| 4,816,361 | 3/1989 | Glendinning | 430/5 |
| 4,818,725 | 4/1989 | Lichtel, Jr. et al. | 437/203 X |
| 4,822,633 | 4/1989 | Inoue | 427/43.1 |
| 4,830,706 | 5/1989 | Horwath et al. | 156/659.1 X |
| 4,876,112 | 10/1989 | Kaito et al. | 427/38 |
| 4,895,735 | 1/1990 | Cook | 427/43.1 |
| 4,961,822 | 10/1990 | Liao et al. | 437/203 X |
| 4,981,715 | 1/1991 | Hirsch et al. | 427/53.1 |
| 4,983,250 | 1/1991 | Pan | 156/628 |
| 5,100,501 | 3/1992 | Blumenthal et al. | 437/203 X |
| 5,104,684 | 4/1992 | Tao et al. | 156/643 X |
| 5,116,463 | 5/1992 | Lin et al. | 156/643 |
| 5,118,385 | 6/1992 | Kumar et al. | 156/644 |
| 5,132,878 | 7/1992 | Carey | 361/410 |
| 5,147,823 | 9/1992 | Ishibashi et al. | 437/228 X |
| 5,156,997 | 10/1992 | Kumar et al. | 437/183 |
| 5,173,442 | 12/1992 | Carey | 437/173 |
| 5,196,102 | 3/1993 | Kumar | 427/528 |
| 5,219,787 | 6/1993 | Carey et al. | 437/187 |
| 5,244,538 | 9/1993 | Kumar | 156/644 X |
| 5,290,732 | 3/1994 | Kumar et al. | 437/196 X |

OTHER PUBLICATIONS

C. D. Cruz et al., "Ion Cluster Emission and Deposition From Liquid Gold Ion Sources", *Journal of Applied Physics*, vol. 58(7), 1 Oct. 1985, pp. 2724–2730.

*Primary Examiner*—Thi Dang
*Attorney, Agent, or Firm*—David M. Sigmond

[57] ABSTRACT

A method of forming an etch mask and patterning a substrate. The method includes directing a particle beam at a substrate without using a mask to deposit an etch mask on the substrate which selectively exposes predetermined portions of the substrate, the etch mask consisting of particles mechanically placed on the substrate by the particle beam, and then etching the exposed portions of the substrate through the etch mask to form channels therein. The process is well suited to fabricating high density copper/polyimide multi-chip modules.

18 Claims, 4 Drawing Sheets

METHOD OF FORMING ETCH MASK USING PARTICLE BEAM DEPOSITION

CROSS-REFERENCE TO RELATED APPLICATIONS

This is a continuation-in-part of copending and coassigned U.S. application Ser. No. 07/736,357 by Kumar entitled *"Method of Patterning Metal on a Substrate Using Direct-Write Deposition of a Mask"* filed Jul. 26, 1991, now U.S. Pat. No. 5,244,538; and is also a continuation-in-part of copending and coassigned U.S. application Ser. No. 08/052,958 by Kumar entitled *"Method of Making a Field Emitter Device Using Randomly Located Nuclei as an Etch Mask"* filed Apr. 23, 1993 now U.S. Pat. No. 5,312,514, which is a continuation of abandoned U.S. application Ser. No. 07/789,220 by Kumar entitled *"Method of Making a Field Emitter Device"* filed Nov. 7, 1991 abandoned; and is also a continuation-in-part of copending and coassigned U.S. application Ser. No. 07/896,126 by Kumar et al. entitled *"Ionized Metal Cluster Beam Systems and Methods"* filed Jun. 9, 1992, now U.S. Pat. No. 5,290,732 which is a continuation-in-part of coassigned International Application no. PCT/US92/01148 (Publication no. WO 92/14260) entitled *"Method of Making Semiconductor Bonding Bumps Using Metal Cluster Ion Deposition"* filed Feb. 10, 1992, which is also a continuation-in-part of coassigned U.S. Ser. No. 07/653,609 by Kumar et al. entitled *"Method of Making Semiconductor Bonding Bumps Using Metal Cluster Ion Deposition"* filed Feb. 11, 1991 (currently U.S. Pat. No. 5,156,997). All of these applications are incorporated herein by reference.

FIELD OF THE INVENTION

The invention relates to forming etch masks on substrates, and more particularly to masklessly depositing an etch mask on a substrate by mechanical placement of particles from a particle beam prior to applying an etch.

DESCRIPTION OF RELATED ART

To form circuits, semiconductors and other electronic components need to be interconnected with each other. As semiconductors continue to improve in performance, cost, reliability and miniaturization, there is an intensive need in the electronics industry, especially for large scale computers, to package and interconnect these semiconductors without limiting system performance. One approach is mounting the components on high density multi-chip module (electrical interconnect substrates). These modules normally contain buried electrical lines or channels which terminate at bonding pads on a mounting surface. By bonding electrical terminals on mounted components to bonding pads on the modules, multiple components can be electrically interconnected.

Applicant's cost modeling on fabrication of high density copper/polyimide modules reveals that, regardless of the fabrication process involved, the three costliest materials are the polyimide, substrate base, and photoresist chemicals. Polyimide costs can be reduced by replacing spin coating with less wasteful approaches, such as extrusion coating. Polyimide expenses can also be reduced by choosing polymers other than traditional polyimides. Photolithography tends to be the most expensive step. During conventional photolithography, resist material is deposited on a smooth upper surface of a layer, the resist layer is photoexposed through suitable artwork to define a pattern of areas where undeveloped resist (which may be exposed or unexposed) is washed away. An etch step is performed on the underlying layer, and the resist is stripped by wet chemicals. As such, photolithography not only requires expensive chemicals and aligners/steppers, but also is typically the most time consuming and labor intensive step. Furthermore, traditional photolithography optical aligners require very flat substrates due to the small depth of focus. This becomes an increasingly major drawback as larger substrates are used. Needless to say, any patterning technique that avoids conventional photolithography is potentially valuable.

Other methods have formerly been developed in order to overcome the drawbacks of photolithography. A main thrust has been to develop several maskless (or re-usable mask) techniques to direct-write metal lines and features directly on substrates. Such direct-write may be provided by liquid metal ion sources, liquid metal cluster sources, laser direct-write, chemical vapor deposition, ink-jet printing, offset printing, palladium activated plating, and electron beam enhanced deposition. These techniques have matured into relatively reliable processes. However, at present, none of these techniques have been widely accepted for manufacturing due to low throughput, poor adhesion, high resistivity, high contact resistance, and poor resolution. Furthermore, the low deposition rates inherent in direct-write often limit its usage to specific applications such as repair and fabrication of very thin lines (0.1 to 1 microns thick). But current multi-chip modules typically require thick metal lines (on the order of 5 to 10 microns) and thus current state-of-the-art direct-write techniques can not form such lines in a practical manner for manufacturing purposes.

Another effort directed to solve the problems associated with photolithography has been maskless direct-write of etch masks. The following are examples:

U.S. Pat. No. 4,566,937 to Pitts describes direct-write of resist patterns on substrates by using a submicron electron beam in a partial pressure of a selected gas phase characterized by the ability to dissociate under the beam into a stable gaseous leaving group and a reactant fragment that combines with the substrate material under beam energy to form at least a surface compound.

U.S. Pat. No. 4,612,085 to Jelks et al. describes a direct-write method of forming a molybdenum oxide plasma etch mask by selective pyrolytic photochemical decomposition of molybdenum hexacarbonyl at the beam spot of an argon laser to deposit a molybdenum oxide etch mask on a metal or dielectric surface.

U.S. Pat. No. 5,147,823 to Ishibashi et al. describes a method of forming a resist pattern by selectively irradiating a charged particle beam onto a substrate in an atmosphere containing a resist material in gaseous form. The charged particle beam is limited to an electron beam, a positron beam, or a muon beam, or the like.

In the forementioned examples, the etch mask is deposited by three-body collision which must conserve energy and momentum for a reaction to occur. That is, the three-body collision includes not only the substrate and the mask material, but also an energy beam such as a laser beam or an electron beam which causes a chemical reaction to occur as the mask is formed. Drawbacks arise with this approach. The maskless laser direct-write of etch masks in U.S. Pat. No. 4,612,085 tends to grow mask features laterally on each side as the thickness of the mask increases. This limits the aspect ratio of the mask openings (height/width) to 0.5. The pyrolyric photochemical decomposition suffers from inaccurate deposition placement due to scattered light. Further, deposition on the view-port through which the substrate is illuminated may cause the process to be unreliable. The maskless electron beam direct-write of etch masks in U.S. Pat. Nos. 4,566,937 and 5,147,823 suffer from the same drawbacks as the laser direct-write with the exception of light scattering.

U.S. application Ser. No. 08/052,958 filed Apr. 23, 1993 (cross-referenced above) describes a method of making a field emitter device which includes depositing in situ by evaporation or sputtering a non-polymerized randomly patterned etch mask with a relatively high melting point on the low work function material, the etch mask comprising randomly located discrete nuclei with discontinuities therebetween thereby exposing portions of the low work function material beneath the discontinuities while covering other portions thereof beneath the nuclei. Thereafter, the exposed portions of the low work function material are removed by an ion etch. Thus, an etch mask is masklessly formed by mechanical placement of particles on a substrate. However, the portions of the substrate which are exposed by the mask are random, reflecting random scattering of the discrete nuclei. While this process is well suited to forming densely packed emission tips for field emitters, it is unsuitable for forming an etch mask to expose predetermined portions of a substrate.

U.S. application Ser. No. 07/736,357 filed Jul. 26, 1991 (cross-referenced above) describes methods of patterning metal on a substrate. A first embodiment includes masklessly depositing a metal etch mask on a dielectric substrate by direct-write using a particle beam to form the etch mask, dry etching the substrate to form a plurality of channels therein, and depositing a conductive metal into the channels. A second embodiment includes forming an etch mask in a predetermined pattern on a dielectric substrate by maskless direct-write deposition using a liquid metal cluster source to form the etch mask, the pattern containing a plurality of openings which selectively expose portions of said substrate, dry etching the exposed portions to form a plurality of channels in the substrate, and depositing a conductive metal into said channels. While these processes include maskless particle beam deposition of an etch mask, they are restricted to dry etching and depositing a conductive metal into the channels.

In sum, there is still a need for forming thin etch masks on substrates to allow patterning channels and/or lines in substrates in a well-controlled, versatile, accurate, reliable and cost effective manner.

SUMMARY OF THE INVENTION

The present invention addresses the forementioned needs by providing mechanical placement of particles on a substrate using direct-write deposition (without a mask or photolithography) to form a thin etch mask which selectively exposes predetermined portions of the substrate. Thereafter, the substrate can be etched through the mask.

An object of the present invention is to pattern relatively thick metal lines by direct-write of thin etch masks without undue time delays. Direct-write is preferably by a liquid metal cluster source, although evaporation through an aperture, offset printing and ink-jet printing are also suitable.

Another object of the present invention is to provide a generic low cost patterning technique which may be used in several process approaches for fabricating copper/polyimide substrates and other types of high density multi-chip modules.

Broadly speaking, the present invention provides a method of forming channels in a substrate by directing a particle beam at a substrate without using a mask to deposit an etch mask on the substrate which selectively exposes predetermined portions of the substrate, the etch mask consisting of particles mechanically placed on the substrate by the particle beam, and then etching the exposed portions of the substrate through the etch mask to form channels in the substrate.

In certain embodiments of the present invention, the substrate may be a dielectric (e.g., a polymer such as polyimide) or a semiconductor, and the etch mask may comprise or consist of a metal such as gold, copper, aluminum, silver, tin, lead, or alloys thereof. Alternatively, the etch mask may be a non-metal such as silicon, silicon oxide, aluminum oxide, silicon carbide, or titanium carbide. The etch may be accomplished by dry etching such as by plasma etching, laser etching, reactive ion etching, ion milling or a combination thereof, or accomplished by wet chemical etching. The particle beam may be a charged particle beam or a neutral particle beam. The particle beam (charged or uncharged) may consist of metal particles furnished by a liquid metal cluster source, or a compound of a reactive gas and the metal particles.

In other embodiments of the present invention, an etch mask is formed on a dielectric substrate, a dry etch forms channels in the dielectric, and the channels are filled with a conductive metal to form submicron patterned metal lines in the substrate. Another etch can then remove the mask, or the mask can remain a permanent part of the substrate.

A key aspect of the present invention is the provision of an etch mask deposited on a substrate by mechanical placement of particles supplied by a particle beam without using a mask. The particles are deposited without three-body collision (as defined herein) and therefore without requiring a laser beam, electron beam, muon beam, positron beam or the like.

An advantage of the present invention is the use of a thin (300 to 2,000 angstrom) sacrificial mask that need not satisfy demanding requirements for quality, resistance, adhesion, or contact resistance which are frequently imposed on direct-write materials. Thin masks are possible due to the large difference in etch rates to standard plasma gases between the mask and the dielectric. The etch rates between gold and polyimide, for example, differ by a factor of approximately 10–20 and thus only a very thin layer of gold is needed for patterning 10 micron thick channels for copper lines in polyimide.

Another advantage of the present invention is the ability to pattern 5 to 10 micron thick conductive lines in a substrate without photolithography yet faster and less expensively than conventional direct-write of conductors.

Still a further advantage of the present invention is the ability to pattern thick conductive lines with high aspect ratios, such as between 5 and 10.

These and other objects, features and advantages of the present invention will be more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

The present invention is directed to forming an etch mask on a substrate so that channels may be etched in the substrate through the mask. As used herein, "channels" refer any groove, indentation or via hole in the surface of a substrate, whether fully or partially through the thickness of the substrate. The channels in multichip modules are normally filled with a conductive metal such as copper. Other fillers include optical conductors and integrated capacitors, as discussed in U.S. Pat. No. 5,219,787 to Carey.

Figure 1:
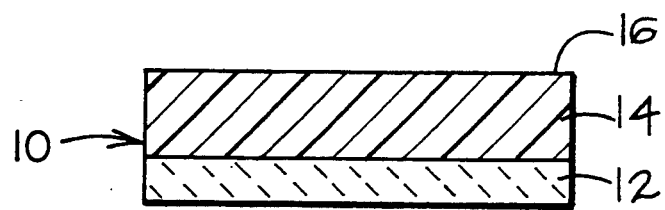
FIG. 1 shows a cross-sectional view of a substrate.

Referring now to the drawings wherein depicted elements are not necessarily shown to scale and wherein like or similar elements are designated by the same reference numeral through the several cross-sectional views and, more particularly to FIG. 1, an electronic component is exemplified as a copper/polyimide electrical interconnect or substrate 10, such as described in U.S. Pat. No. 5,132,878 to Carey. For illustration purposes, a substrate is shown comprising a ceramic base 12 supporting 10 microns thick polyimide 14 with a smooth, substantially planar top surface 16. It should be appreciated that dielectric substrates (such as organic polymer substrates) as well as semiconductor substrates are also suitable.

Figure 2:
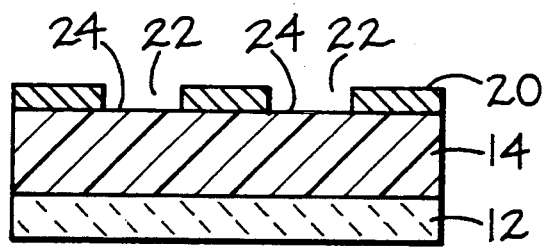
FIG. 2 shows a cross-sectional view of an etch mask formed by maskless direct-write of mechanically placed particles on the substrate.

Referring now to FIG. 2, a thin etch mask is formed on the substrate by mechanical placement of particles supplied by a direct-write particle beam without using a mask. The deposited etch mask consists of particles from the particle beam mechanically placed on the substrate. The etch mask is formed in a predetermined pattern with a plurality of openings which selectively expose portions of the substrate to be etched through the mask in order to form grooves in the substrate.

The preferred source for the beam is a liquid metal cluster source, for instance by depositing a focused cluster of ion beams as disclosed by C.D. Cruz et al. in "Ion Cluster Emission and Deposition From Liquid Gold Ion Sources," *Journal of Applied Physics*, Vol. 58(7), Oct. 1, 1985, pp. 2724–2730, the disclosure of which is incorporated herein by reference. Building on the teachings in Cruz et al., U.S. Pat. No. 5,156,997 by Kumar et al. (cross-referenced above) discloses a method of making semiconductor bonding bumps using metal cluster ion deposition; U.S. application Ser. No. 07/896,126 by Kumar et al. filed Jun. 9, 1992 (also cross-referenced above) further provides a method of depositing alloyed metal bumps with constant composition using a plurality of sources to direct elemental ionized metal clusters at the bump, and further describes the removal of metal deposited by an ionized metal cluster beam in a focusing aperture by using an ion beam generated by the same or a different source than the cluster beam source.

In addition, the maskless direct-write of the present invention can be performed a particle beam furnished by an evaporation source with an aperture, by offset printing (inorganic or metal-organic) or by ink-jet printing.

Metal masks are normally preferred since they tend to be the most highly resistive to a dry etch as discussed below. A liquid metal cluster source is particularly well suited to forming metal masks of the present invention. Suitable metals for the mask include gold, copper, silver, aluminum, tin, lead and alloys thereof, with gold most preferred.

The mask may also be a non-metal, particularly if the mask remains a permanent part of the substrate. For instance, liquid cluster ion deposition and evaporation through an aperture may provide silicon beams.

Non-metal masks may also be provided using a liquid metal cluster source. For instance, a method of applying a compound of a metal and a reactive gas onto a surface is disclosed in U.S. Pat. No. 5,196,102 by Kumar, which is incorporated herein by reference, wherein a liquid metal cluster ion source is isolated from the reactive gas by inserting an inert gas spaced from the ion source and between the ion source and the reactive gas at a pressure greater than the pressure of the reactive gas. Metal compounds which may be obtained include oxides, nitfides, sniffdes and carbides. For example, aluminum oxide can be formed using aluminum with oxygen; titanium nitride can be formed by the combination of titanium and $NH_3$ or $N_2$; zinc sulfide may be formed using zinc and $H_2S$ gas. Likewise, titanium may be reacted with $CH_4$ to form titanium carbide.

Furthermore, the teachings of U.S. Pat. No. 5,196,102 can be used for applying a compound of a non-metal and a reactive gas onto a surface. For example, a silicon particle beam may be reacted with oxygen to form a silicon oxide mask. Alternatively, the silicon beam may be reacted with $CH_4$ to deposit a mask consisting of silicon carbide particles.

Normally the ion beam furnished by a liquid cluster ion source is a charged particle beam. For instance, in U.S. Pat. No. 5,196,102 the liquid metal source consists of a tungsten wire loop reservoir attached to a ceramic base, and a small tungsten wire needle spotwelded to the loop at its apex. The loop reservoir is charged with the appropriate metal (such as gold), is resistively heated by passing current therethrough. After the metal melts, the metal wets the needle. An electric field is applied to the liquid metal surface by positively biasing the needle with respect to one or more extractor rings. As a result, the liquid surface on the needle becomes electrohydrodynamically unstable, leading to the formation of a conical protrusion on the surface of the liquid at the place where the electric field has sufficient strength. When the apex electric field becomes strong enough, ion emission takes place. In sum, ions and charged droplets or clusters of the desired metal in a molten state are generated and accelerated by field emission.

However, it may be desirable for the particle beam to be rendered electrically neutral before the particles strike the substrate. In particular, if the substrate is a dielectric, a charged beam will charge up the dielectric which may eventually cause beam spreading and loss of resolution. To overcome this difficulty, the particle beam can be neutralized with an electron beam. A field emission gun can generate an electron beam having good coherence. It is critical to note that the use of an electron beam to neutralize the particle beam of the present invention does not cause three-body collision as the particles are deposited on the substrate.

In the embodiment illustrated herein, the particle beam is a liquid metal cluster beam consisting of charged metal particles. A 300 angstrom thick gold mask 20 is deposited on top surface 16 by maskless direct-write from a liquid metal cluster source. Mask 20 is configured in a predetermined pattern containing a plurality of through-holes or openings 22 which selectively expose portions 24 of polyimide 14. In the present embodiment a relatively thin mask between approximately 300 to 2,000 angstroms thick is preferred. Thinner layers may be unreliable; thicker layers may require lengthy deposition times. The optimum mask thickness is approximately 300 angstroms.

Figure 3:
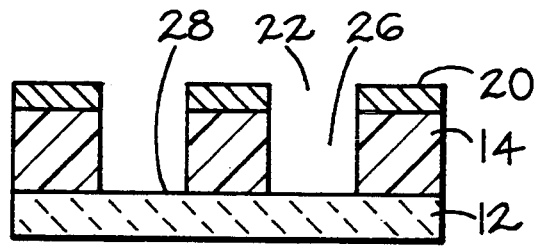
FIG. 3 shows a cross-sectional view of channels etched in the exposed portions of the substrate.

With reference now to FIG. 3, portions of the substrate exposed through the mask are etched to form channels in the substrate. A dry etch is preferred although wet chemical etching is also suitable, particularly for wider features less susceptible to undercut by the etchant. Suitable dry etching techniques include plasma etching, laser etching, reactive ion etching and ion milling. Reactive ion etching, for instance with an $O_2 CF_4$ gas mixture, is generally faster than ion milling or laser etching. Most preferred is an anisotropic plasma etch. In the present example, exposed portions 24 are plasma etched through openings 22. At this time, gold mask 20 etches approximately 10 to 20 times slower than polyimide 14. This assures mask 20 protects polyimide 14 outside openings 22 throughout the etching. Also, ceramic base 12 is highly resistive to the dry etch. As a result, 10 micron deep vertical channels 26 extend completely through polyimide 14 directly beneath openings 22, and the top of base 12 beneath openings 22 becomes channel bottoms 28. The sidewalls of channels 26 may taper inwardly slightly with increasing depth (not shown), for instance by 2-5 degrees. Alternatively, channels 26 can be formed to partially extend through polyimide 14. For instance (not shown), a reactive ion etch could form channels 5 microns deep, and a laser beam could impinge upon the channel bottoms to drill smaller vias through the remaining 5 microns of polyimide.

While not essential to the present invention, after the channels are formed typically a conductive material is deposited into the channels. Most often an electrically conductive metal fills the channels to form patterned metal within the substrate, although the channels may be filled, for instance, with optical conductors or integrated capacitors. Many combinations of filler materials, etchants, predetermined patterns, deposition techniques and process sequences are suitable and well known in the art. See, e.g., U.S. Pat. Nos. 5,173,442 and 5,219,787 by Carey. Generally, copper and aluminum are the preferred metals, with electrolessly plated copper most preferred. While not mandatory, after metal is deposited in the channels additional processing steps can be taken. For example, if the metal is to remain "buried" in the dielectric then the mask can be removed and the top of the substrate planarized by polishing. If, on the other hand, the metal is to protrude above the substrate then the mask can be removed by a first wet chemical etch and the unetched dielectric within the metal pattern can be removed by a second wet chemical etch. Several such combinations of filling metal into the channels are illustrated in FIGS. 4A-4D, 5A-5D, 6A-6C, and 7A-7D. Obviously, there is no attempt to provide an exhaustive list of combinations.

Figure 4A:
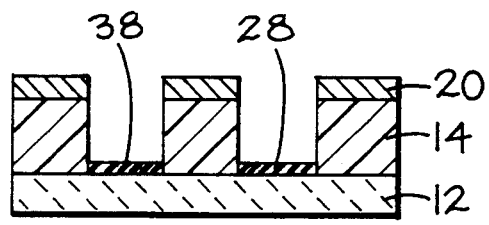
FIGS. 4A–4D show cross-sectional views of one approach for depositing metal in the channels.
Figure 4B:
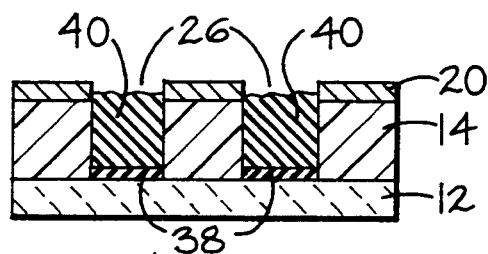
Figure 4C:
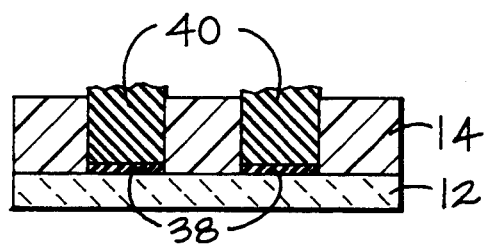

Referring now to FIGS. 4A-4D, a first embodiment for depositing metal into the channels in shown. In FIG. 4A an electroless activator (autocatalyst or seed) is deposited into the channels. As may been seen, a thin layer of tungsten 38 is deposited on channel bottoms 28 by chemical vapor deposition. In FIG. 4B copper 40 is electrolessly plated in channels 26. Detection of electroless via fill can be provided as described in U.S. Pat. No. 5,116,463 by Linet al. In FIG. 4C mask 20 is removed by applying a wet chemical etch, and in FIG. 4D the top surface 41 is planarized by polishing.

Figure 5A:
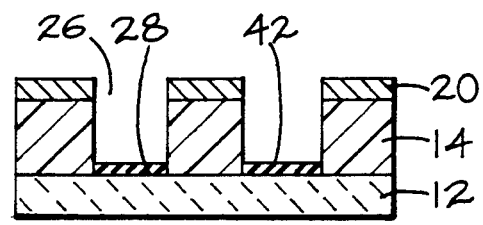
FIGS. 5A–5D show cross-sectional views of another approach for depositing metal in the channels.
Figure 5B:
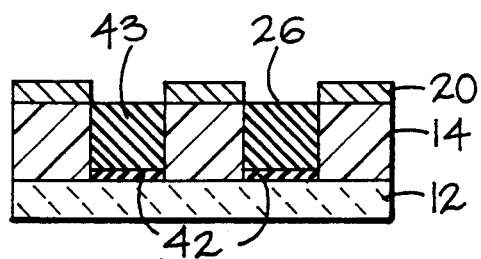
Figure 5C:
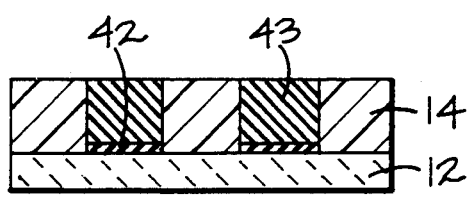
Figure 4D:
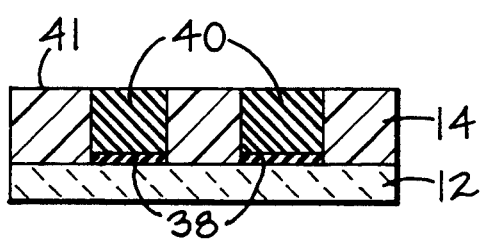
Figure 5D:
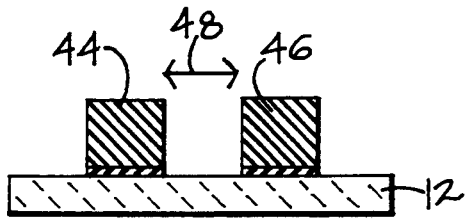

Referring now to FIGS. 5A-5D, a second embodiment for depositing metal into the channels in shown. In FIG. 5A an electroless activator is deposited into the channels by laser decomposition of palladium 42. In FIG. 5B copper 43 is electrolessly plated in channels 26. In FIG. 5C mask 20 is removed by applying a wet chemical etch, and in FIG. 5D the polyimide between the copper lines is removed by a second wet chemical etch. Copper lines 44 and 46 are seen as 10 microns thick and separated by a 2 micron space 48 from the nearest lines, resulting in an aspect ratio of 5 for lines 44 and 46.

Figure 6A:
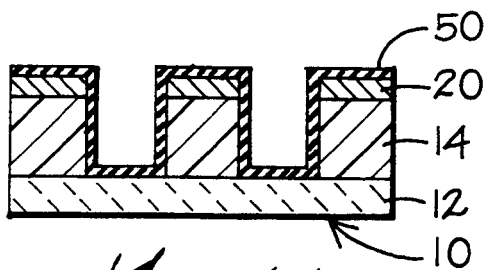
FIGS. 6A–6C show cross-sectional views of a still further approach for depositing metal in the channels.
Figure 7A:
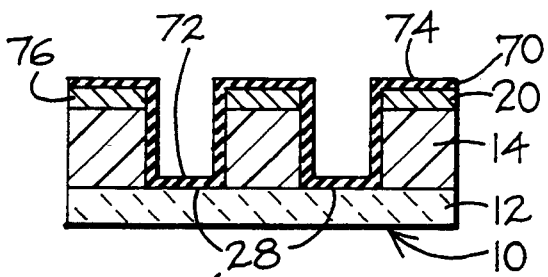
FIGS. 7A–7D show cross-sectional views of yet another approach for depositing metal in the channels.
Figure 6B:
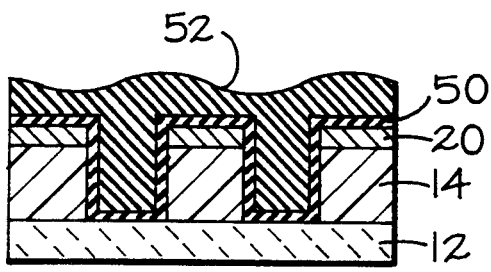
Figure 6C:
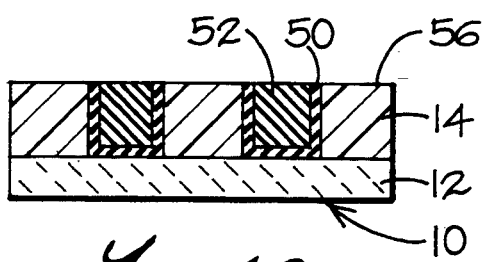
Figure 7C:
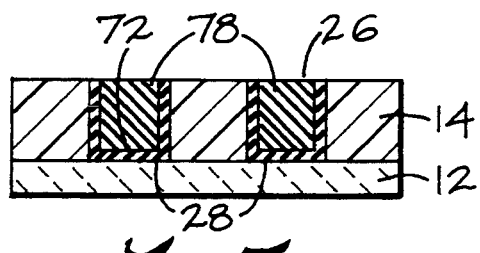
Figure 7D:
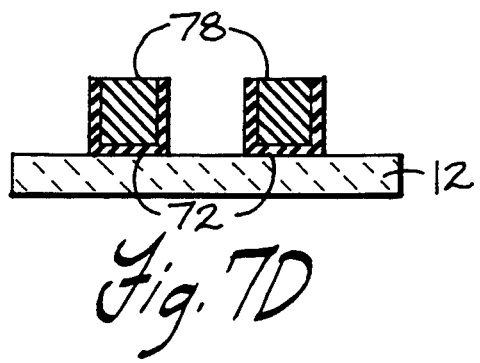

With reference now to FIGS. 6A-6C, a third embodiment for depositing metal into the channels in shown. In FIG. 6A, a blanket 700 angstrom chromium adhesion layer 50 is deposited over all of substrate 10. In FIG. 6B, copper 52 is deposited by one of sputtering, evaporating, or chemical vapor deposition on all of chromium 50. Thereafter, in FIG. 6C, mechanical polishing is applied to the top of substrate 10 to remove all of mask 20, chromium 50 and copper 52 above dielectric top surface 16, leaving copper 52 in and aligned with a smooth planar top surface 56.

Figure 7B:
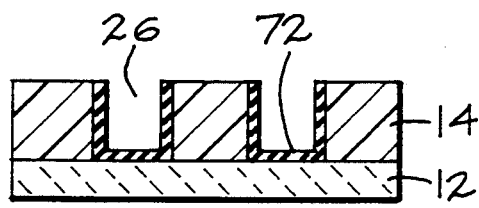

With reference now to FIGS. 7A-7D, a fourth embodiment for depositing metal into the channels in shown. Beginning in FIG. 7A, a 1,000 angstrom blanket layer of chromium 70 is deposited over substrate 10. Chromium portions 72 are seen to cover channel bottoms 28 and chromium portions 74 cover mask 20. In FIG. 7B, a wet etch is applied which initially attacks sides 76 (shown in FIG. 7A) of mask 20 and subsequently dissolves all of mask 20, thereby "lifting off" chromium portions 74 from the substrate. Such lift off processes are well known in the art. Thereafter, in FIG. 7C copper 78 is electrolessly deposited on chromium portions or seeds 72 to fill channels 26. Finally, in FIG. 7D a wet etch is applied to remove the polyimide between the copper lines so that the lines protrude above the substrate.

Figure 8:
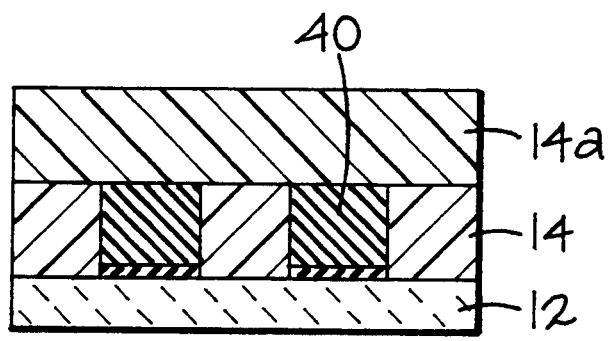
FIG. 8 shows a cross-sectional view of another layer deposited on the structure of FIG. 4D.
Figure 9:
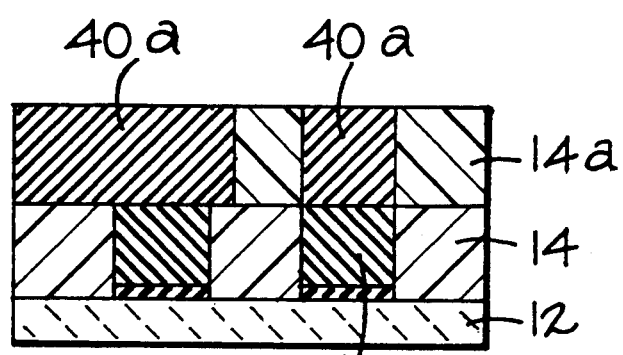
FIG. 9 shows a cross-sectional view of a multilayer structure fabricated by repeating previous steps.

As should be clear to those skilled in the art, the forementioned steps can be repeated to construct a multilayer structure. Referring now to FIG. 8, wherein like parts are similarly numbered with the addition of the suffix "a", second polymer layer 14a is deposited on the structure in FIG. 4D. Thereafter, as seen in FIG. 9, the previously described steps are repeated to form a multilayer structure with a plurality of conductive metal channels 40a in second layer 14a.

In addition, stripping mask 20 takes advantage of polymer-to-polymer adhesion between layers 14 and 14a. In other embodiments it may be desirable to have a non-conducting mask remain a permanent part of the substrate.

Finally, it is important to note that the present invention may be performed in a vacuum environment.

Furthermore, the present invention may suitably comprise, consist essentially of, or consist of the previously described process steps.

The present invention, therefore, is well adapted to carry out the objects and attain the ends and advantages mentioned, as well as others inherent therein. While presently preferred embodiments of the present invention have been described for the purpose of disclosure, numerous other changes and modifications in the details of construction, arrangement of parts and steps of processing can be carried out without departing from the spirit of the invention which is intended to be limited only by the scope of the appended claims.

What is claimed is:

1. A method of forming channels in a substrate, comprising the steps of:
   directing a particle beam at a substrate by direct-write using a liquid metal cluster source without using a mask to deposit an etch mask on the substrate which selectively exposes predetermined portions of the substrate, said etch mask consisting of particles mechanically placed on the substrate by the particle beam; and then
   etching the exposed portions of the substrate through the etch mask to form channels in the substrate and removing the etch mask from the substrate.

2. The method of claim 1 wherein said substrate is selected from the group consisting of dielectrics and semiconductors.

3. The method of claim 2 wherein said dielectrics are polymers.

4. The method of claim 1 wherein said etch mask comprises a metal.

5. The method of claim 1 wherein said etch mask consists of a metal.

6. The method of claim 5 wherein said metal is selected from the group consisting of gold, copper, aluminum, silver, tin, lead, and alloys thereof.

7. The method of claim 1 wherein said mask is a non-metal.

8. The method of claim 7 wherein said non-metal is selected from the group consisting of silicon, oxides, nitrides, sulfides and carbides.

9. The method of claim 1 wherein said etch is a dry etch.

10. The method of claim 9 wherein said dry etch is performed by plasma etching, laser etching, reactive ion etching, ion milling or a combination thereof.

11. The method of claim 1 wherein said particles consist of metal particles furnished by one or more liquid metal cluster sources.

12. The method of claim 1 wherein said particles consist of a compound of a reactive gas and metal particles furnished by one or more liquid metal cluster sources.

13. The method of claim 1 wherein said particles are furnished by a charged particle beam.

14. A method of forming channels in a substrate, comprising the steps of:
   directing a neutral particle beam at a substrate, by direct-write using a liquid metal cluster source without using a mask to deposit an etch mask on the substrate which selectively exposes predetermined portions of the substrate, said etch mask consisting of particles mechanically placed on the substrate by the neutral particle beam; and then
   etching the exposed portions of the substrate through the etch mask to form channels in the substrate.

15. A method of forming channels in a substrate, comprising the steps of:
   directing a particle beam at a substrate without using a mask to deposit an etch mask on the substrate which selectively exposes predetermined portions of the substrate, said etch mask consisting of particles mechanically placed on the substrate by the particle beam rendered neutral by an electron beam; and then
   etching the exposed portions of the substrate through the etch mask to form channels in the substrate.

16. A method of forming channels in a substrate, comprising the steps of:
   directing a particle beam at a substrate without using a mask to deposit an etch mask on the substrate which selectively exposes predetermined portions of the substrate, said etch mask consisting of particles mechanically placed on the substrate by the particle beam wherein said particles are mechanically placed on said substrate without assistance from an electron beam, laser beam, muon beam, positron beam or offset printing; and then
   etching the exposed portions of the substrate through the etch mask to form channels in the substrate and removing the etch mask from the substrate.

17. The method of claims 1, 14, 15, or 16 wherein said etch mask is formed without three-body collision as said particles are deposited.

18. The method of claims 1, 14, 15 or 16 wherein said etch mask is formed without decomposition of a precursor vapor.

* * * * *